(12) United States Patent
Hirayanagi

(10) Patent No.: US 6,399,945 B1
(45) Date of Patent: Jun. 4, 2002

(54) BACKSCATTERED-ELECTRON DETECTION SYSTEMS AND ASSOCIATED METHODS

(75) Inventor: Noriyuki Hirayanagi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/363,299

(22) Filed: Jul. 28, 1999

(30) Foreign Application Priority Data

Jul. 28, 1998 (JP) .......................................... 10-226580

(51) Int. Cl.[7] ............................................. H01J 37/244
(52) U.S. Cl. ...................................... 250/310; 250/397
(58) Field of Search .................................. 250/310, 397

(56) References Cited

U.S. PATENT DOCUMENTS 5,182,454 A * 1/1993 Matsuda et al. ............ 250/397

* cited by examiner

*Primary Examiner*—Kiet T. Nguyen
(74) *Attorney, Agent, or Firm*—Klarquist Sparkman LLP

(57) ABSTRACT

Backscattered electron (BSE) detection systems are disclosed that produce a detection-signal waveform exhibiting large signal-level changes with corresponding changes in the locus, on a sample, irradiated by a scanning electron beam. Hence, the position of a pattern feature on a sample is detectable with improved accuracy. An electron beam irradiates a sample comprising a relatively low-mass substrate and a relatively high-mass pattern feature thereon. Backscattered electrons from the substrate and from the pattern element are detected using a first BSE detector having a first energy-sensitivity band, and a second BSE detector having a second energy-sensitivity band that is different from the first energy-sensitivity band. The signal from the first BSE detector is combined with the signal from the second BSE detector to produce a detection-signal waveform exhibiting large changes in signal amplitude with changes in the locus actually irradiated by the electron.

21 Claims, 5 Drawing Sheets

BACKSCATTERED-ELECTRON DETECTION SYSTEMS AND ASSOCIATED METHODS

FIELD OF THE INVENTION

The present invention pertains to systems for detecting backscattered electrons propagating from an object being irradiated with an electron beam or other charged particle beam. Such detection systems are utilized, for example, in charged-particle-beam microlithography apparatus and methods requiring accurate alignment of a reticle pattern with a desired projection location on a substrate. More specifically, the invention pertains to backscattered-electron detection systems that produce a high signal-to-noise (S/N) ratio for greater detection (and hence alignment) accuracy.

BACKGROUND OF THE INVENTION

A conventional backscattered-electron (BSE) detector system is shown in FIGS. 9(a)–9(b). Such BSE detector systems are typically included with electron-beam microlithography apparatus for use in, e.g., aligning the silicon substrate prior to the substrate being exposed by electron-beam irradiation.

In FIG. 9(a), a sample 107 comprises a substrate 104 made of a relatively "light" (low mass) element such as silicon. Pattern features 105 are formed on the surface of the sample 107. The pattern features 105 are made of a relatively "heavy" (high mass) element such as tantalum. An electron beam EB incident to the surface of the substrate 107 is scanned in the direction of the "scan" arrow along the dashed line 108. As the incident electrons in the beam EB penetrate into the sample 107, they experience many scattering events that produce backscattered electrons 103. The backscattered electrons 103 are detected by BSE detectors 101 and 101'.

The signal produced by the BSE detectors 101, 101' as the electron beam EB passes over the feature elements 105 is profiled in FIG. 9(b). FIG. 9(b) also depicts a representative relationship between the specific location on the sample 107 being irradiated by the electron beam EB versus the amplitude of the electrical signal produced by the BSE detectors 101, 101'.

Conventional BSE detectors 101, 101' commonly comprise PN-junction or PIN-junction semiconductors for detecting backscattered electrons. The detector junction is biased and, as backscattered electrons impinge on the detector junction, corresponding changes in current or voltage flowing through the junction are produced to generate a detector signal. The amplitude of the detector signal is a function of the energy of the corresponding incident backscattered electrons. The detector signal is normally amplified.

The energy of electrons backscattered from the sample 107 differs according to the specific material on which the electron beam EB is incident (e.g., on a pattern feature 105 versus on the surface of the substrate 104). Hence, as the electron beam EB encounters different materials on the sample 107, the amplitude of the signal produced by the BSE detectors 101, 101' changes. This phenomenon is exploited for detecting, using the BSE detectors 101, 101', the presence and position of a pattern on the sample 107. For example, prior to performing a microlithographic exposure of the substrate 104 using the electron beam, the location of an alignment mark on the substrate 104 is detected, using the BSE detection system of FIGS. 9(a)–9(b), so as to positionally align the substrate for exposure.

SUMMARY OF THE INVENTION

A general object of the invention is to increase the accuracy with which a pattern feature on a sample can be detected, compared to the performance of the conventional BSE detector system summarized above. The initial approach was to increase the differences in energy exhibited by backscattered electrons from various regions on the sample. As noted above, the energy of electrons backscattered from a substance is characteristic of the substance and is normally different for different substances. Another variable that influences the energy of backscattered electrons is the thickness of the substance on which the beam is incident. Hence, in order to increase the difference in energy of electrons backscattered from various materials, increasing the thickness of pattern features (e.g., elements of an alignment mark) was initially considered.

However, modern methods for fabricating semiconductor devices typically include one or more planarization steps, generally performed by chemical-mechanical polishing or an analogous technique. This has made it difficult to provide a suitably thick alignment-mark pattern, for example, for obtaining a desired large difference in energy of backscattered electrons as the electron beam passes over an alignment mark on a planarized surface.

In view of the above, an object of the present invention is to provide BSE detection systems capable of producing and detecting large changes in detection-signal amplitude as the beam is incident on various materials on the sample surface. The resulting detection signals produced by such systems have an increased signal-to-noise ratio and increased position-detection accuracy.

According to a first aspect of the invention, detection systems are provided for detecting electrons backscattered from a locus on a sample surface irradiated with an electron beam. A representative embodiment of such a system comprises first and second BSE detectors. The first BSE detector has a first prescribed "energy-sensitivity band" (i.e., the first BSE detector is sensitive to electrons having respective energies within a first energy range), and is configured and situated so as to receive a first group of backscattered electrons propagating from the locus due to irradiation of the locus with the electron beam. The first BSE detector produces, from the received backscattered electrons, a first electrical signal. Similarly, the second BSE detector has a second prescribed energy-sensitivity band (i.e., the second BSE detector is sensitive to electrons having respective energies within a second energy range) that is different from the first energy-sensitivity band. The second BSE detector is configured and situated so as to receive a second group of backscattered electrons propagating from the locus due to irradiation of the locus with the electron beam, and to produce from the received backscattered electrons a second electrical signal. The system includes a signal combiner connected to the first and second BSE detectors. The signal combiner is configured to combine the first and second signals together yielding a composite output-signal waveform having an amplitude that differs depending upon a characteristic of the locus.

A typical characteristic of the locus is the specific material of the locus. For example, the sample can comprise a substrate surface including a pattern feature. In such an instance, the output signal produced by the signal combiner has a waveform corresponding to irradiation of the substrate surface and the pattern feature with the electron beam.

According to a first example embodiment of a detection system according to the invention, the first and second BSE detectors are solid-state detectors, in which each first and second BSE detector comprises a PN or PIN junction with a respective depletion layer. Desirably, at least one of a depth and width of the respective depletion layer is adjustable so as to adjust the energy-sensitivity band of each BSE detector. If the output signal waveform of the first BSE detector is denoted $S_A$ and the output signal waveform of the second BSE detector is denoted $S_B$, then the signal combiner produces a composite signal according to the expression: $S_A - \alpha S_B$.

Multiple first and second solid-state BSE detectors can be used. For example two first BSE detectors can be used, designated "A" and "A'", and two second BSE detectors can be used, designated "B" and "B'". In such an instance, the combiner produces a composite output signal waveform according to the expression:

$$(S_A + S_{A'}) - \alpha(S_B + S_{B'})$$

wherein $S_A$ and $S_{A'}$ denote respective output waveforms from the first solid-state detectors A, A', and $S_B$ and $S_{B'}$ denote respective output waveforms from the second solid-state detectors B, B', and $\alpha$ denotes a coefficient.

The number of detectors is not limited to one or two for each energy-sensitivity band. By way of example, four detectors for each energy-sensitivity band are possible and work well. In general, "n" detectors can be provided for the first energy-sensitivity band and "m" detectors can be provided for the second energy-sensitivity band, wherein n and m are integers that desirably, but not necessarily, are equal. Under such conditions, the expression above is of the form:

$$(S_{A1} + S_{A2} + \ldots + S_{An}) - \alpha(S_{B1} + S_{B2} + \ldots + S_{Bm})$$

wherein $S_{Ai}$ (i=1, 2, . . . , n) denotes an output signal waveform from a respective first detector and $S_{Bi}$ (i=1, 2, . . . , m) denotes an output signal waveform from a respective second detector, and $\alpha$ denotes a coefficient.

According to a second example embodiment of a detector system according to the invention, each first BSE detector is a solid-state detector comprising a detection surface, and each second BSE detector comprises an electrically conductive film situated upstream of the detection surface of the solid-state detector. The film is configured to cut off certain backscattered electrons from the surface of the sample. The film desirably has a thickness suitable for absorbing or otherwise cutting off backscattered electrons having an energy less than at least a peak of an energy distribution of the backscattered electrons produced by the irradiated sample surface. For example, if the sample surface is irradiated with an electron beam accelerated by a potential difference of no greater than 100 KV, the film can be made of silicon having a thickness of at least 10 μm but not greater than 40 μm. As an alternative to silicon, the film can be made of metal.

The backscattered electrons from the surface of the sample referred to above desirably arise from portions of the sample surface other than the irradiated pattern feature. It is desirable that the thickness of the thin film be such that, of the backscattered electrons produced by the surface of the sample, backscattered-electrons having the highest energies (or nearly the highest energies) are absorbed or otherwise cut off by the thin film.

According to a third example embodiment of a detector system according to the invention, the first BSE detector is a solid-state detector comprising a detection surface, and the second BSE detector comprises an electrically conductive mesh situated upstream of the detection surface of the solid-state detector. The mesh desirably is charged with a positive voltage so as to decelerate backscattered electrons passing through the mesh. Further desirably, the positive voltage is sufficient to cut off an energy band of backscattered electrons from the surface of the sample. For example, the positive voltage can be sufficient to cut off backscattered electrons having an energy less than at least a peak of an energy distribution of the backscattered electrons produced by the irradiated sample surface. Desirably, the positive voltage corresponds to the approximately highest energy level within the energy distribution of backscattered electrons produced by the sample surface. By way of example, the sample is irradiated with an electron beam accelerated by a potential difference of no greater than 100 KV. In such an instance, the positive voltage is at least 40 KV and not greater than 70 KV.

According to another aspect of the invention, detection systems are provided for detecting electrons backscattered from a sample surface irradiated with an electron beam, wherein the sample surface includes a pattern feature. Such a system comprises at least two types of backscattered-electron detectors each having a mutually different energy-sensitivity band. The system also comprises a means for selecting for use, among the two or more types of BSE detectors, the one or two types of BSE detectors best suited to the characteristics of the sample.

According to another aspect of the invention, methods are provided for detecting electrons backscattered from a locus on a sample surface irradiated with an electron beam. A representative embodiment of such a method comprises, as a first step, detecting from the locus backscattered electrons having respective energies within a first energy band and producing a corresponding first electrical signal. Backscattered electrons from the locus are also detected having respective energies within a second energy band, from which a corresponding second electrical signal is produced. The first and second electrical signals are combined to produce a composite output signal waveform having an amplitude that differs depending upon a characteristic of the locus.

According to another embodiment of a method according to the invention, a first BSE detector is provided having a first prescribed energy-sensitivity band, and a second BSE detector is provided having a second prescribed energy-sensitivity band different from the first energy-sensitivity band. The first BSE detector is positioned so as to receive a first group of backscattered electrons propagating from the locus due to irradiation of the locus with the electron beam. A first electrical signal is produced corresponding to the energy-sensitivity band of backscattered electrons detected by the first BSE detector. The second BSE detector is positioned so as to receive a second group of backscattered electrons propagating from the locus due to irradiation of the locus with the electron beam. A second electrical signal is produced corresponding to the energy-sensitivity band of backscattered electrons detected by the second BSE detector. The first and second electrical signals are combined to produce a composite output signal waveform having an amplitude that differs depending upon a characteristic of the locus. By combining the first and second electrical signals, a desired detection signal waveform can be obtained exhibiting large signal-level changes as the electron beam is scanned across the sample.

The foregoing and additional features and advantages of the invention will be more apparent from the following detailed description, which proceeds with reference to the accompanying drawings.

DETAILED DESCRIPTION

Figure 1:
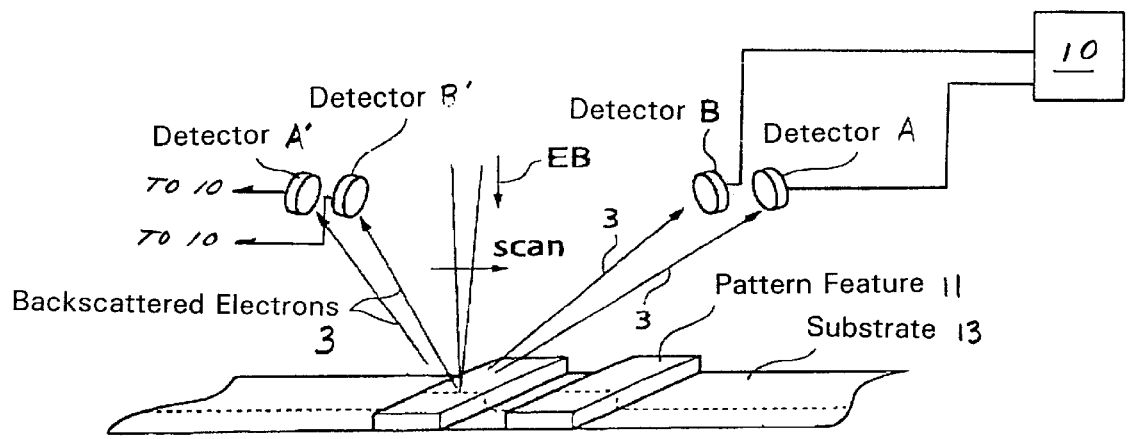
FIG. 1 is a simplified depiction of a backscattered-electron (BSE) detection system, according to a first representative embodiment of the present invention, being used to detect backscattered electrons produced by a sample being irradiated by an electron beam.

A first representative embodiment of a backscattered electron (BSE) detector system according to the invention is shown schematically in FIG. 1. To produce the backscattered electrons, an electron beam EB is used to irradiate a surface of a substrate 13. The FIG.-1 embodiment comprises four solid-state (PN or PIN junction) BSE detectors A, A', B, B'. The BSE detectors A, A' have an energy-sensitivity band that is different from the energy-sensitivity band of the BSE detectors B, B'. The BSE detectors A, A' desirably have the same energy detection sensitivity. Similary, the BSE detectors B, B' desirably have the same energy detection sensitivity. The BSE detectors A, A', B, B' are connected to a signal combiner 10.

In this embodiment, two BSE detectors are employed for each energy-sensitivity band. Plural (i.e., two or more) detectors for each energy-sensitivity band are desirable to obtain an improved signal-tonoise ratio of BSE detection by the detectors. Plural detectors are also desirable because of the typically non-uniform directional distribution of backscattered electrons from the sample 13. For example, the detectors A', B' can detect backscattered electrons propagating toward the left in FIG. 1, and the detectors A, B can detect backscattered electrons propagating toward the right in FIG. 1.

The substrate 13 is made of a relatively light element such as silicon (having an atomic weight of 28). The surface of the substrate 13 includes pattern features 11 made of a relatively heavy element such as tantalum (having an atomic weight of 181). The pattern features 11 can be, e.g., elements of an alignment mark on the substrate 13. The electron beam EB incident to the surface of the substrate 13 is scanned in the direction of the "scan" arrow. As electrons of the impinging beam EB penetrate into the substrate 13 or into a pattern feature 11, the incident electrons experience many scattering events that produce backscattered electrons 3. The energy of the backscattered electrons varies depending upon the material on which the electron beam EB is incident. The backscattered electrons 3 are detected by the BSE detectors A, A' and B, B' depending upon the energy of the backscattered electrons relative to the energy-sensitivity band of the BSE detectors A, A' and B, B'.

Within each of the BSE detectors A, A' and B, B', incident backscattered electrons 3 having an energy within the respective band are captured to produce a corresponding signal. For each backscattered electron captured by a BSE detector, the corresponding signal is amplified by an amplification factor that corresponds to the specific energy level of the backscattered electron. I.e., the gain is higher for higher-energy backscattered electrons than for lower-energy backscattered electrons. As the electron beam EB is scanned across the surface of the sample, the signals produced by the BSE detectors exhibit respective amplitudes that differ depending upon the specific material on which the electron beam is incident. I.e., the amplitude of the signal produced when the electron beam EB is incident on the substrate 13 is different from the amplitude of the signal produced when the electron beam is incident on a pattern feature 11.

Figure 2:
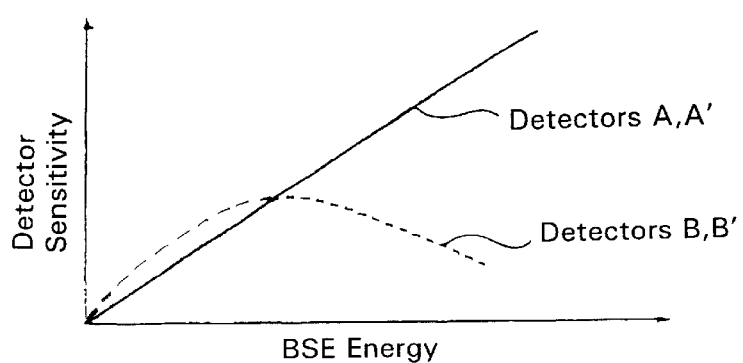
FIG. 2 is a graph of the different energy sensitivity characteristics of two types of solid-state BSE detectors (A and A', and B and B' in FIG. 1) to backscattered electrons having different energy levels.

An exemplary difference in energy sensitivity of the BSE detectors A, A' versus the BSE detectors B, B' is illustrated in FIG. 2. As shown in FIG. 2, the energy-detection sensitivity of the BSE detectors A and A' is high which is useful for detecting backscattered electrons having a relatively high energy. The energy-detection sensitivity of the BSE detectors B and B' is lower which is useful for detecting backscattered electrons having a relatively low energy. To achieve such differential sensitivity, the energy sensitivity of the PN or PIN junction in any of the BSE detectors A, A', B, B' can be adjusted by controlling the depth and/or width of their respective depletion layers.

Figure 3:
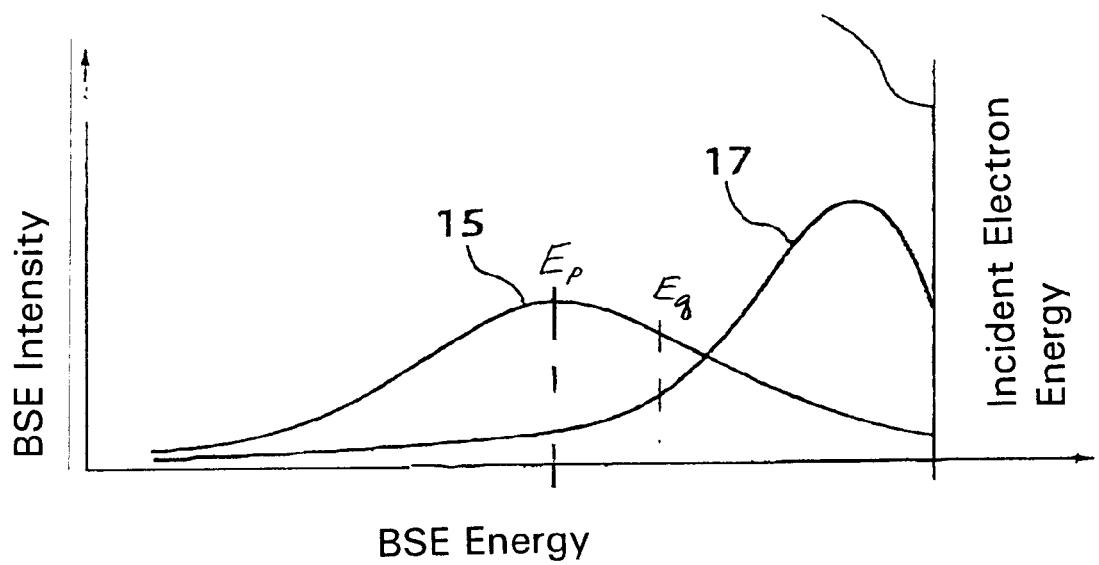
FIG. 3 is a graph showing the relationship between the intensity and energy of backscattered electrons arising from impingement of the electron beam on the substrate (made of a light element) compared to impingement of the electron beam on a pattern feature (made of a heavy element) using the FIG. 1 embodiment.

FIG. 3 is a graph showing a representative relationship between BSE signal amplitude and BSE energy produced by the substrate 13 (made of a relatively light element) and the pattern feature 11 (made of a relatively heavy element) in FIG. 1. In FIG. 3, the curve 15 represents a distribution of energy of backscattered electrons from the substrate 13, and the curve 17 represents a distribution of energy of backscattered electrons from the pattern feature 11. From this graph it can be seen that the energy distribution 17 for the heavy element is different from the energy distribution 15 for the light element, with the heavy element exhibiting a higher level of backscattered electron energy. Whenever the electron beam EB scans over the surface of the substrate 13, the energy distribution of backscattered electrons is according to the curve 15, and more of such backscattered electrons are detected by the detectors B, B'. Whenever the electron beam EB scans over a pattern feature 11, the energy distribution of backscattered electrons is according to the curve 17, and more of such backscattered electrons are detected by the detectors A, A'.

Figure 4:
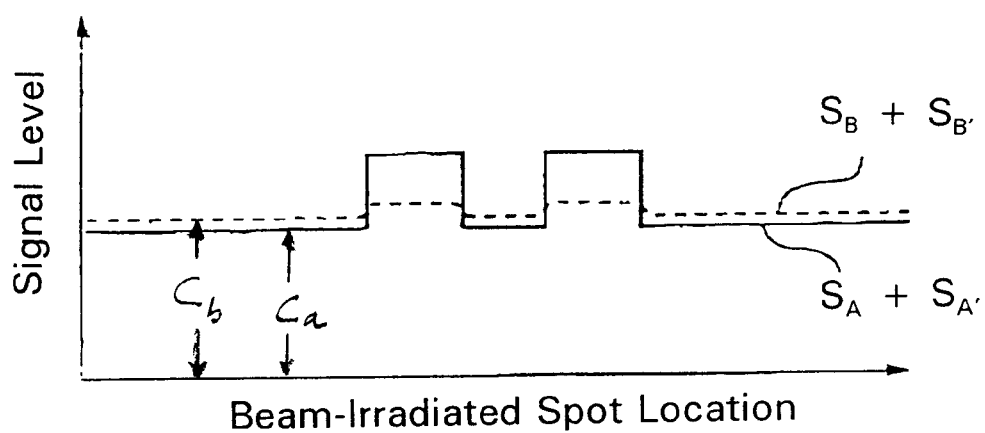
FIG. 4 is a graph of the signal level versus beam-irradiated spot location produced by backscattered electrons detected by the BSE detection system of FIG. 1.

In view of the different energy-sensitivity bands of the BSE detectors A, A' compared to the BSE detectors B, B', FIG. 4 shows representative signal waveform profiles produced by the detectors A and A' and the detectors B, B'. In FIG. 4, the waveform $S_A+S_{A'}$ is the sum of respective signal waveforms produced by the detectors A and A', and the waveform $S_B+S_{B'}$ is the sum of respective signal waveforms produced by the detectors B and B'. (Each detector A, A' produces substantially the same waveform, even though the amplitude of the waveform from each detector A, A' may be slightly different. The same applies to the respective waveforms produced by the detectors B, B'.

In each waveform shown in FIG. 4, the elevated "steps" correspond to impingement of the electron beam EB on respective pattern features 11 (FIG. 1). Hence, the signal level produced by a BSE detector A, A' or B, B' depends in part upon the specific locus (e.g., substrate or feature) on the sample being irradiated by the electron beam EB and in part upon whether the detector is of the group A, A' or of the group B, B'.

Figure 5:
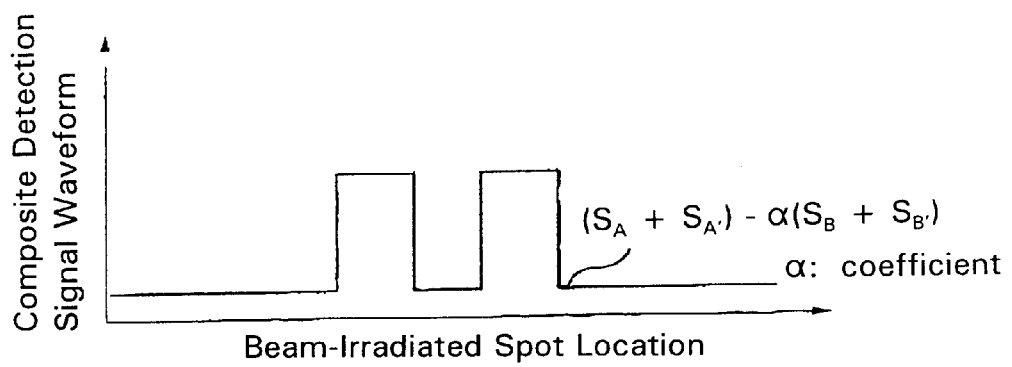
FIG. 5 is a graph showing a composite detection synthesized from the signal waveforms of FIG. 4, using a given coefficient $\alpha$.

The composite waveform shown in FIG. 5 is obtained by combining (using the signal combiner 10) the waveforms of FIG. 4, while applying a coefficient α in the following expression:

$$\text{Composite waveform} = (S_A+S_{A'}) - \alpha(S_B+S_{B'})$$

In the expression above, each of $S_A$, $S_{A'}$, $S_B$, and $S_{B'}$ is a separate waveform signal, normally in voltage units (but can be in any other suitable units). The coefficient α can be determined, by way of example, by setting the output from the sample surface at zero. In such an instance, $\alpha=C_a/C_b$ (see FIG. 4) Typically, α is within a range of −0.9 to 1.1, and is non-dimensional.

Thus, backscattered electrons 3 are detected using the solid-state BSE detectors A and A' having a first energy-sensitivity band in combination with solid-state BSE detectors B and B' having a second energy-sensitivity band. As the electron beam EB passes over the substrate 13 and the pattern features 11 on the substrate, the resulting composite detection signal exhibits large changes of signal level. The signal-level changes are larger than otherwise would be obtained using a BSE detection system that uses solid-state BSE detectors A, A' or B, B' having only a single energy-sensitivity band. By thus improving the signal-to-noise (S/N) ratio, this embodiment provides a more accurate detection of the location of a pattern feature on a substrate. With such a system, the signal-level ratio of backscattered electrons from the pattern feature versus from the substrate surface is sufficient to accurately detect the position of the pattern feature 11, even whenever the pattern feature 11 has little thickness.

In the foregoing embodiment, although the BSE detection system is provided with two types of solid-state BSE detectors (A, A' and B, B'), the BSE system alternatively can be provided with three or more types of BSE detectors. In such an instance, each type of BSE detector desirably has an energy sensitivity that is different from the other types. Also, in such an instance, the BSE detection system includes means for adjusting the optimum sensitivity levels for the characteristics of the sample being scanned. Such a configuration provides detectability for many different types of samples.

Figure 6:
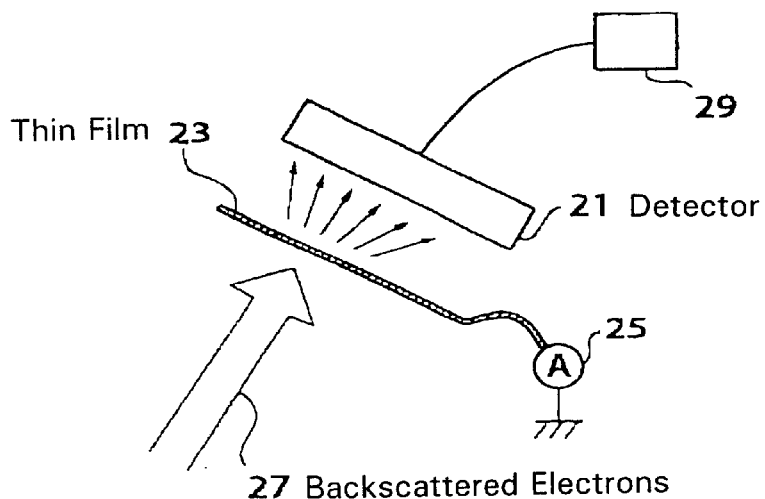
FIG. 6 is a simplified depiction of a BSE detection system according to a second representative embodiment of the invention.

FIG. 6 shows a BSE detection system according to a second representative embodiment of the present invention. The FIG. 6 embodiment comprises a first type of solid-state BSE detector 21 connected to an amplifier 29. An electrically conductive thin film 23 (a silicon thin film, for example) is situated upstream of the BSE detector 21. Hence, backscattered electrons 27 must pass through the thin film 23 to reach the BSE detector 21.

The thin film 23 is electrically connected to a current meter 25, the other side of which meter is connected to ground. Thus, the thin film 23 serves as a second BSE detector. The thin film 23 has a thickness sufficient to block passage of a certain energy band of backscattered electrons. To illustrate, the thin film 23 can be configured to block the peak portion of the energy distribution represented by curve 15 of FIG. 3 (i.e., to block backscattered electrons, from the substrate or other light element, at the peak of the energy distribution of such backscattered electrons). For example, if the backscattered electrons from the substrate exhibit an energy distribution with a peak at 50 KeV, a silicon thin film 23 having a thickness of approximately 20 to 30 μm would be appropriate to block the peak portion of the distribution. To a degree, the proper thickness for the thin film 23 can be determined readily from the BSE energy peak cutoff value. An example of such a determination is as follows (from Reimer, *Scanning Electron Microscopy*, Springer Verlag, 1985, pp. 96–101): From Table 3.2 of Reimer (page 100 of that reference), $R_x=(20/3)E^{5/3}$. At E=50 KeV, $R_x=4524$ μg/cm². If the film density is about 2.34 g/cm³, then penetration depth is $4524 \times 10^{-6}/2.34 = 1.933 \times 10^{-3}$, which is about 20 to 30 μm.

Figure 7:
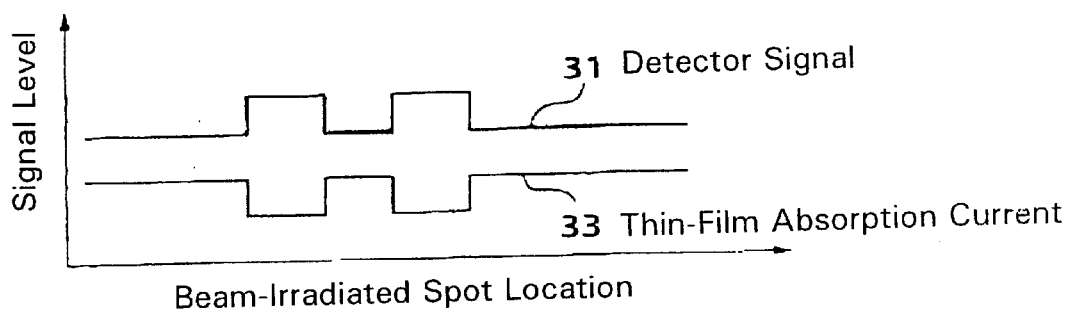
FIG. 7 is a graph showing the relationship between signal level and beam-irradiated spot location from backscattered electrons detected when an electron beam is scanned across a sample pattern as shown in FIG. 1 using the BSE detection system shown in FIG. 6.

FIG. 7 is a graph showing a relationship between the locus (on the sample) being irradiated by the electron beam EB being scanned across the sample of FIG. 1, and the level of the signal detected by the BSE detection system of FIG. 6. In FIG. 7, the reference number 31 denotes the waveform of the detection signal produced by the detector 21. The reference number 33 denotes the waveform of the detection signal produced by current flowing in the thin film 23 due to absorption of backscattered electrons, as measured by the current meter 25.

As mentioned earlier, the sample of FIG. 1 comprises a relatively light element (substrate) and one or more pattern features made of a relatively heavy element deposited on the surface of the substrate. This difference in the surface of the sample causes electrons backscattered from the sample to have the two energy distributions 15, 17, respectively, shown in FIG. 3. Of these, most of the backscattered electrons from the substrate are scattered by or absorbed in the thin film 23. The resulting current flow in the thin film 23 is measured by the current meter 25. Although the thin film 23 absorbs some of the backscattered electrons from the pattern feature, most of them pass through the thin film 23 and are detected by the detector 21. This differential absorption of backscattered electrons by the thin film 23 produces the detection-signal waveforms 31 and 33 of FIG. 7.

More specifically, as shown in FIG. 3, electrons backscattered from the substrate surface have a lower energy distribution denoted by curve 15 that has a peak denoted by $E_p$. To obtain a satisfactory signal-to-noise ratio, the thin film 23 desirably absorbs electrons having respective energies at least less than $E_p$. More desirably, the thin film 23 absorbs electrons having respective energies less than $E_q$ to prevent electrons backscattered from the substrate surface from reaching the detector 21.

By combining the signal waveforms 31 and 33 obtained in this manner, and applying a coefficient "α" as described above in connection with FIGS. 4 and 5, a composite detection signal waveform is obtained. The composite signal waveform exhibits large changes in signal level with corresponding changes in the locus on the sample being irradiated. Thus, this embodiment produces the same advantages as the first representative embodiment described above.

Although the thin film 23 used in the second embodiment desirably is made of silicon, the material of the thin film 25 is not limited to silicon. A thin film of any of various other materials may be used so long as the selected thin film is capable of blocking backscattered electrons having a prescribed energy bandwidth as described above. A metallic or other electrically conductive thin film, for example, can be used for this purpose.

Also, although the BSE detection system of this embodiment comprises only one type of thin film 23 and one type of solid-state BSE detector 21, two or more types of thin films and/or BSE detectors can alternatively be used. In the alternative configuration, the BSE detectors can have different respective energy-sensitivity bands. The alternative configuration can also comprise means for adjusting the energy-sensitivity band of the solid-state BSE detector 21 and of the thin film 23 for the particular characteristics of the sample being scanned, and for adjusting the gain of the amplifier 29. This makes it possible to scan and obtain meaningful data from many different kinds of samples.

Figure 8:
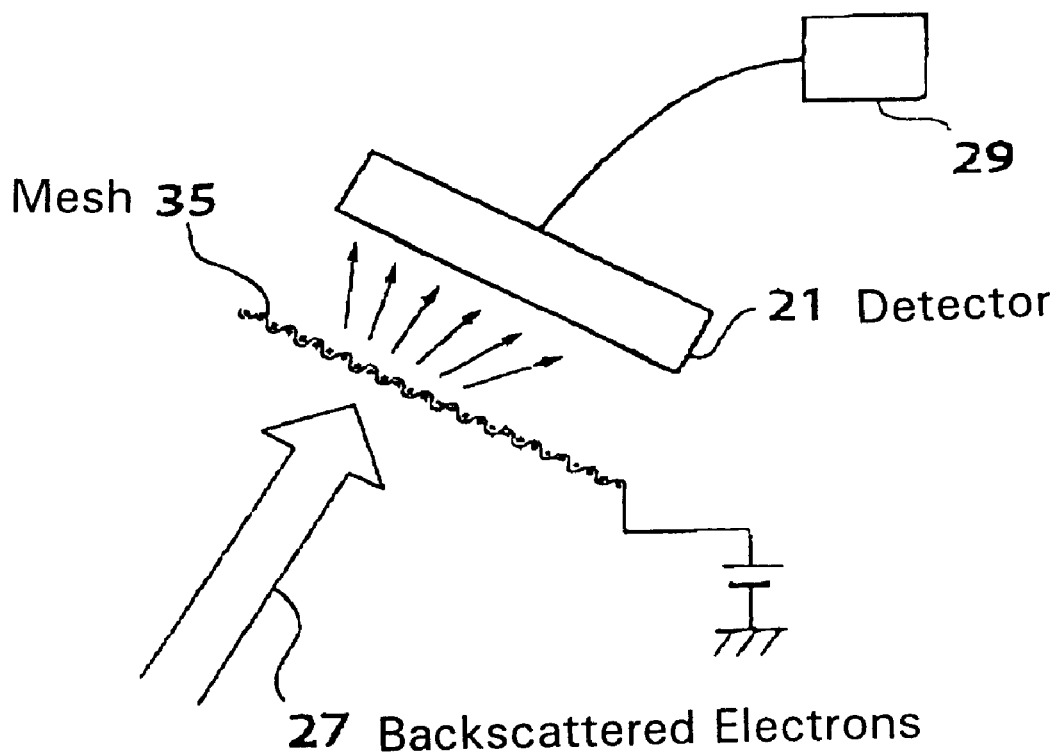
FIG. 8 is a simplified depiction of a BSE detection system according to a third representative embodiment of the invention.
Figures 9A, 9B:
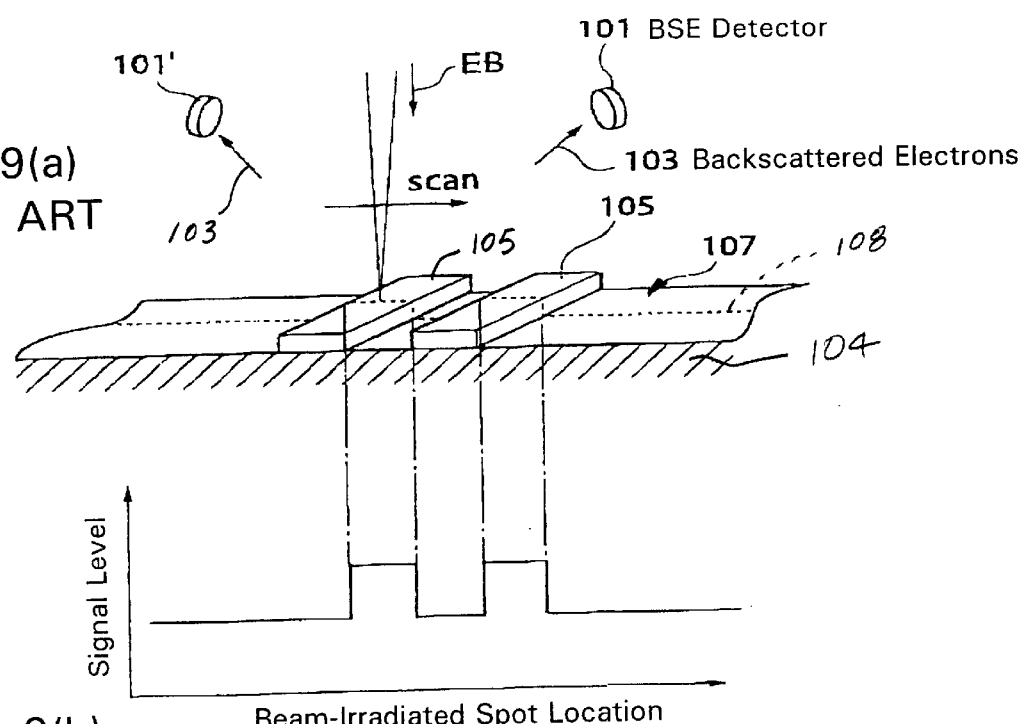
FIG. 9(a) is a simplified depiction of a conventional BSE detection system being used to detect backscattered electrons produced by a sample being irradiated by an electron beam.
FIG. 9(b) is a graph showing the relationship between signal level and beam-irradiated spot location from backscattered electrons detected by the BSE detection system of FIG. 9(a).

FIG. 8 depicts certain aspects of a BSE detection system according to a third representative embodiment of the invention. In FIG. 8, components that are the same as in FIG. 6 have the same reference numbers, and only those features in the FIG.-8 embodiment that are different are described below.

Immediately upstream of the detection surface of the solid-state BSE detector 21 is a mesh (made, e.g., of woven copper wire) 35. A positive voltage desirably is applied to the mesh 35. The positive voltage creates an electric field on the mesh 35 that decelerates backscattered electrons 27 propagating to the BSE detector 21. The positive voltage can be used to set the band of the energy distribution curve 15 of FIG. 3 (i.e., the energy distribution of backscattered electrons from the light substrate) that is blocked by the mesh. For example, if the electron beam irradiating the sample has an acceleration voltage of 100 KV, an appropriate value for the voltage applied to the mesh 35 would 40 KV to 70 KV.

The advantages of the third representative embodiment described above are similar to the advantages realized with the first representative embodiment. That is, the mesh 35 decelerates most of the backscattered electrons produced by impingement of the electron beam on the light substrate. Most of the backscattered electrons from the relatively heavy-element pattern feature, however, pass through the mesh 35 and are detected by the detector 21. Accordingly, at the detector 21, the signal level resulting from detection of backscattered electrons from the heavy element is increased relative to the signal level resulting from detection of backscattered electrons from the light element.

In this embodiment, although a copper mesh 35 desirably is used, the material of the mesh is not limited to copper. For example, a mesh made of any other suitable material alternatively may be used, so long as the material has good electrical conductivity.

Therefore, the present invention provides a BSE detection-signal waveform exhibiting large signal-level changes with changes in the locus actually being irradiated by a scanning electron beam. Such larger signal changes provide BSE detection systems that detect the position of a pattern element on a sample with improved accuracy.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A detection system for detecting electrons backscattered from a locus on a sample surface irradiated with an electron beam, the system comprising:

(a) a first backscattered-electron detector, having a first prescribed energy-sensitivity band, configured and situated so as to receive a first group of backscattered electrons propagating from the locus due to irradiation of the locus with the electron beam, and to produce, from the received backscattered electrons, a first electrical signal;

(b) a second backscattered-electron detector, having a second prescribed energy-sensitivity band different from the first energy-sensitivity band, configured and situated so as to receive a second group of backscattered electrons propagating from the locus due to irradiation of the locus with the electron beam, and to produce, from the received backscattered electrons, a second electrical signal;

(c) a signal combiner connected to the first and second backscattered-electron detectors, the signal combiner being configured to combine the first and second signals, yielding a composite output signal waveform having an amplitude that differs depending upon a characteristic of the locus.

2. The detection system of claim 1, wherein:

the sample comprises a substrate surface including a pattern feature; and the output signal produced by the signal combiner has a waveform corresponding to irradiation of the substrate surface and the pattern feature with the electron beam.

3. The detection system of claim 1, wherein the first and second backscattered-electron detectors are solid-state detectors.

4. The detection system of claim 3, wherein each first and second backscattered-electron detector comprises a PN or PIN junction with a respective depletion layer.

5. The detection system of claim 4, wherein at least one of a depth and width of the respective depletion layer is adjustable so as to adjust the energy-sensitivity band of each backscattered-electron detector.

6. The detection system of claim 3, comprising multiple first and second solid-state detectors.

7. The detection system of claim 6, wherein the combiner produces a composite output signal waveform according to the expression:

$$(S_A + S_{A'}) - \alpha(S_B + S_{B'})$$

wherein $S_A$ and $S_{A'}$ denote respective output-signal waveforms from the first solid-state detectors, $S_B$ and $S_{B'}$ denote respective output-signal waveforms from the second solid-state detectors, and $\alpha$ denotes a coefficient.

8. The detection system of claim 1, wherein:

the first backscattered-electron detector is a solid-state detector comprising a detection surface; and the second backscattered-electron detector comprises an electrically conductive film situated upstream of the detection surface of the solid-state detector, the film being configured to cut off backscattered electrons from the surface of the sample.

9. The detection system of claim 8, wherein the film has a thickness suitable for absorbing backscattered electrons of energy less than at least a peak of an energy distribution of the backscattered electrons produced by the irradiated sample surface.

10. The detection system of claim 8, wherein:
the sample surface is irradiated with an electron beam accelerated by a potential difference of no greater than 100 KV; and
the film is made of silicon and has a thickness of at least 10 μm but not greater than 40 μm.

11. The detection system of claim 8, wherein the film is made of metal.

12. The detection system of claim 1, wherein:
the first backscattered-electron detector is a solid-state detector comprising a detection surface; and
the second backscattered-electron detector comprises an electrically conductive mesh situated upstream of the detection surface of the solid-state detector, the mesh being charged with a positive voltage so as to decelerate backscattered electrons passing through the mesh.

13. The detection system of claim 12, wherein the positive voltage is sufficient to cut off an energy band of backscattered electrons from the surface of the sample.

14. The detection system of claim 13, wherein the positive voltage is sufficient to cut off backscattered electrons of energy less than at least a peak of an energy distribution of the backscattered electrons produced by the irradiated sample surface.

15. The detection system of claim 12, wherein:
the sample is irradiated with an electron beam accelerated by a potential difference of no greater than 100 KV; and
the positive voltage is at least 40 KV and not greater than 70 KV.

16. The detection system of claim 1, wherein the combiner is configured to produce a composite output signal waveform according to the expression:

$$S_A - \alpha S_B$$

wherein $S_A$ denotes an output-signal waveform of the first signal, $S_B$ denotes an output-signal waveform of the second signal, and α denotes a coefficient.

17. A detection system for detecting electrons backscattered from a sample surface irradiated with an electron beam, the sample surface having a pattern feature thereon, the system comprising:
(a) at least two types of backscattered-electron detectors each having a mutually different energy-sensitivity band; and
(b) means for selecting for use, among the two or more types of backscattered-electron detectors, the one or two types of backscattered-electron detectors best suited to the characteristics of the sample.

18. A detection system for detecting electrons backscattered from a locus on a sample surface, irradiated with an electron beam, the system comprising:
(a) multiple first detectors each sensitive to electrons having respective energies within a first energy band, each first detector being disposed separately from each other to receive electrons propagating from the locus due to irradiation of the locus with the electron beam, and to produce, from the received backscattered electrons, respective first electrical signals;
(b) multiple second detectors each sensitive to electrons having respective energies within a second energy band different from the first energy band, each second detector being disposed separately from each other to receive electrons propagating from the locus due to irradiation of the locus with the electron beam, and to produce, from the received backscattered electrons, respective second electrical signals; and
(c) a signal combiner connected to the first detectors and the second detectors, the signal combiner being configured to combine the respective first and respective second signals, yielding a composite output signal waveform having an amplitude that differs depending upon a characteristic of the locus.

19. The detection system of claim 18, comprising (n) first detectors and (m) second detectors, wherein:
n and m are integers greater than 1 and can be equal or not equal; and
the combiner produces a composite output signal waveform according to the expression:

$$(S_{A1}+S_{A2}+ \ldots +S_{An})-\alpha(S_{B1}+S_{B2}+ \ldots +S_{Bm})$$

wherein $S_{Ai}$ (i=1, 2, . . . , n) denotes an output waveform from a respective first detector and $S_{Bi}$ (i=1, 2, . . . , m) denotes an output waveform from a respective second detector, and α denotes a coefficient.

20. A method for detecting electrons backscattered from a locus on a sample surface irradiated with an electron beam, the method comprising:
(a) detecting backscattered electrons of a first energy band from the locus and producing a corresponding first electrical signal;
(b) detecting backscattered electrons of a second energy band of backscattered electrons from the locus and producing a corresponding second electrical signal; and
(c) combining the first and second electrical signals to produce a composite output signal waveform having an amplitude that differs depending upon a characteristic of the locus.

21. A method for detecting electrons backscattered from a locus on a sample surface irradiated with an electron beam, the method comprising:
(a) providing a first backscattered-electron detector having a first prescribed energy-sensitivity band;
(b) providing a second backscattered-electron detector having a second prescribed energy-sensitivity band different from the first energy-sensitivity band;
(c) positioning the first backscattered-electron detector so as to receive a first group of backscattered electrons propagating from the locus due to irradiation of the locus with the electron beam;
(d) producing a first electrical signal corresponding to the energy-sensitivity band of backscattered electrons detected by the first backscattered-electron detector;
(e) positioning the second backscattered-electron detector so as to receive a second group of backscattered electrons propagating from the locus due to irradiation of the locus with the electron beam;
(f) producing a second electrical signal corresponding to the energy-sensitivity band of backscattered electrons detected by the second backscattered-electron detector; and
(g) combining the first and second electrical signals to produce a composite output signal waveform having an amplitude that differs depending upon a characteristic of the locus.

* * * * *

UNITED STATES PATENT AND TRADEMARK OFFICE
CERTIFICATE OF CORRECTION

PATENT NO. : 6,399,945 B1
DATED : June 4, 2002
INVENTOR(S) : Hirayanagi

It is certified that error appears in the above-identified patent and that said Letters Patent is hereby corrected as shown below:

Column 5,
Line 58, "signal-tonoise" should be -- signal-to-noise --.

Column 7,
Line 7, "different. The" should be -- different). The --.
Line 29, "FIG. 4)" should be -- FIG. 4). --.

Column 8,
Line 67, "thin film 25" should be -- thin film 23 --.

Column 9,
Line 36, "would 40" should be -- would be 40 --.

Signed and Sealed this

Sixteenth Day of December, 2003

JAMES E. ROGAN
*Director of the United States Patent and Trademark Office*